US012730768B2

(12) United States Patent
Born et al.

(10) Patent No.: US 12,730,768 B2
(45) Date of Patent: Sep. 8, 2026

(54) STACKED DIE CROSSING

(71) Applicant: Advanced Micro Devices, Inc., Santa Clara, CA (US)

(72) Inventors: Richard Martin Born, Fort Collins, CO (US); Carl Dietz, Fort Collins, CO (US); James Wingfield, Austin, TX (US)

(73) Assignee: Advanced Micro Devices, Inc., Santa Clara, CA (US)

(*) Notice: Subject to any disclaimer, the term of this patent is extended or adjusted under 35 U.S.C. 154(b) by 29 days.

(21) Appl. No.: 18/927,485

(22) Filed: Oct. 25, 2024

(65) Prior Publication Data

US 2026/0119421 A1 Apr. 30, 2026

(51) Int. Cl.
*G06F 13/20* (2006.01)
*H10W 90/00* (2026.01)

(52) U.S. Cl.
CPC ........... *G06F 13/20* (2013.01); *H10W 90/00* (2026.01); *G06F 2213/40* (2013.01)

(58) Field of Classification Search
CPC ..... H10W 90/00; G06F 13/20; G06F 2213/40
See application file for complete search history.

(56) References Cited

U.S. PATENT DOCUMENTS

2014/0181428 A1* 6/2014 Hsu .................... G06F 12/0246 711/154
2020/0126993 A1* 4/2020 Narui .................. G11C 19/287
2025/0022527 A1* 1/2025 Chandrakanthan .......................... G11C 29/1201
2025/0378039 A1* 12/2025 Boecker ............. G06F 13/4009

* cited by examiner

*Primary Examiner* — Zachary K Huson
(74) *Attorney, Agent, or Firm* — Greenberg Traurig, LLP

(57) ABSTRACT

The disclosed systems and methods provide signal crossing across die boundaries of stacked dies. By having a queue structure coupled to a multiplexer hierarchy, clock skew and other differences between stacked dies can be addressed without require a prohibitive number of TSVs, BPVs, or other vertical interconnects. Various other methods, systems, and computer-readable media are also disclosed.

20 Claims, 7 Drawing Sheets

STACKED DIE CROSSING

BACKGROUND

Stacked die processor architectures (e.g., 2.5D or 3D architectures) include a die stacked over another die which can allow integration of various components, such as active and/or passive chips. Such architectures can provide higher functionality packaging density, reduced communication latency, and reduced energy consumption to improve computing efficiency. 3D architectures allow, for example, logic-on-logic or memory-on-logic chiplet stacking to allow integration of different chip sizes, functionalities and/or wafer node technologies into a single platform. Chips on an upper layer can require connections through layers thereunder, using for example vertical interconnects such as through-silicon-vias (TSVs), bond-pad-vias (BPVs), and/or other types of vertical die interconnects. Different chips can exhibit process skew differences, further complicating communication therebetween.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Figure 1:
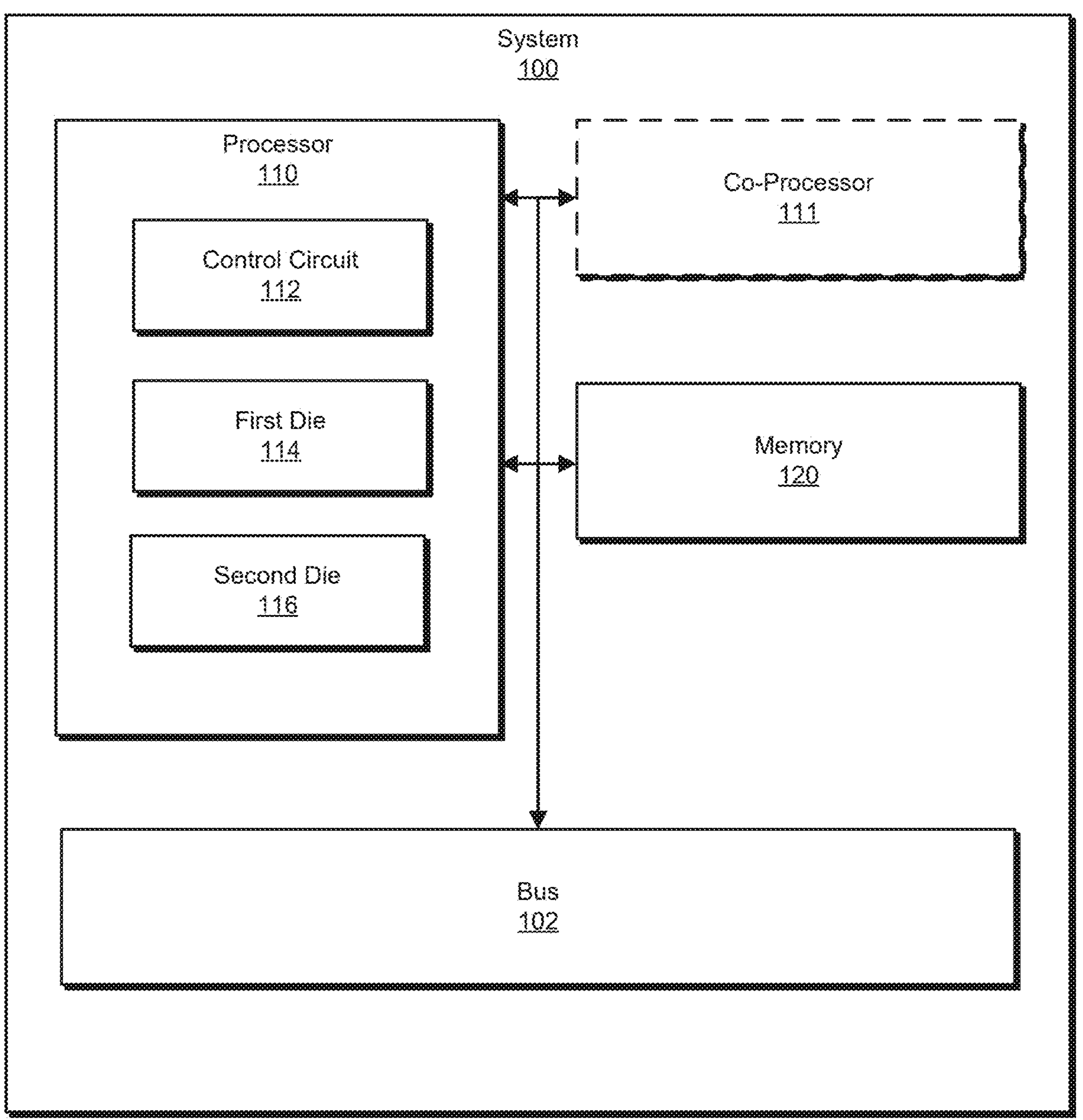
FIG. 1 is a block diagram of an exemplary system for stacked die crossing of signals.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to efficient designs for stacked die crossing of signals. As will be explained in greater detail below, implementations of the present disclosure include a control circuit managing a queue structure for queuing data signals between stacked dies, and a multiplexer circuit connected to each element of the queue structure to allow a reduced number of vertical interconnects between the stacked dies. In some implementations, such an architecture can also reduce a number of level shifters needed for crossing voltage domains of the stacked dies. The systems and methods provided herein can advantageously improve performance of processors while providing more efficient layouts that may reduce power consumption as well as simplify fabrication.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIGS. 1-7, detailed descriptions of stacked die crossing. Detailed descriptions of example device architectures will be provided in connection with FIGS. 1 and 2. Detailed descriptions of example layouts will be provided in connection with FIGS. 3-6. Detailed descriptions of corresponding methods will also be provided in connection with FIG. 7.

FIG. 1 is a block diagram of an example system 100 for stacked die crossing. System 100 corresponds to a computing device, such as a desktop computer, a laptop computer, a server, a tablet device, a mobile device, a smartphone, a wearable device, an augmented reality device, a virtual reality device, a network device, and/or an electronic device. As illustrated in FIG. 1, system 100 includes one or more memory devices, such as memory 120. Memory 120 generally represents any type or form of volatile or non-volatile storage device or medium capable of storing data and/or computer-readable instructions. Examples of memory 120 include, without limitation, Random Access Memory (RAM), Read Only Memory (ROM), flash memory, Hard Disk Drives (HDDs), Solid-State Drives (SSDs), optical disk drives, caches, variations, or combinations of one or more of the same, and/or any other suitable storage memory.

As illustrated in FIG. 1, example system 100 includes one or more physical processors, such as processor 110, which can correspond to one or more processors (e.g., a host processor along with a co-processor, which in some examples can be separate processors). Processor 110 generally represents any type or form of hardware-implemented processing unit capable of interpreting and/or executing computer-readable instructions. In some examples, processor 110 accesses and/or modifies data and/or instructions stored in memory 120. Examples of processor 110 include, without limitation, one or more instances of chiplets (e.g., smaller and in some examples more specialized processing units that can coordinate as a single chip), microprocessors, microcontrollers, Central Processing Units (CPUs), Field-Programmable Gate Arrays (FPGAs) that implement softcore processors, Application-Specific Integrated Circuits (ASICs), systems on chip (SoCs), digital signal processors (DSPs), Neural Network Engines (NNEs), accelerators, accelerated processing units (APUs), portions of one or more of the same, variations or combinations of one or more of the same (e.g., a host processor and a co-processor), and/or any other suitable physical processor(s). Further, in some examples, processor 110 can be a general-purpose processor that can be capable, without significant limitation, of various computing tasks, as opposed to a special purpose processor that can be limited in computing tasks (e.g., specially designed for particular computing tasks such as moving data, performing certain mathematical operations, etc.), although in other examples processor 110 can correspond to and/or incorporate one or more special purpose processors.

As also illustrated in FIG. 1, example system 100 can in some implementations optionally include one or more physical co-processors, such as co-processor 111, which in other implementations can be integrated with or otherwise represented by processor 110. Co-processor 111 generally represents any type or form of hardware-implemented processing unit capable of interpreting and/or executing computer-readable instructions, which in some examples works in conjunction and/or based on instructions from a host/main processor such as a CPU (e.g., processor 110). In some examples, co-processor 111 accesses and/or modifies data and/or instructions stored in memory 120. Examples of co-processor 111 include, without limitation, chiplets (e.g., smaller and in some examples more specialized processing units that can coordinate as a single chip), microprocessors, microcontrollers, graphics processing units (GPUs), Field-Programmable Gate Arrays (FPGAs) that implement soft-core processors, Application-Specific Integrated Circuits (ASICs), systems on chip (SoCs), digital signal processors (DSPs), Neural Network Engines (NNEs), accelerators, accelerated processing units (APUs), portions of one or more of the same, variations or combinations of one or more of the same, and/or any other suitable physical processor.

FIG. 1 also includes a bus 102 that can correspond to any bus, circuitry, connections, and/or any other communicative pathways for sending communicative signals, based on one or more communication protocols, between components/devices (e.g., processor 110, memory 120, and/or co-processor 111, etc.). In some implementations, bus 102 can further connect, via wireless and/or wired connections, to other devices, such as peripheral devices external to or partially integrated with system 100.

As further illustrated in FIG. 1, processor 110 includes a control circuit 112, a first die 114, and a second die 116. Control circuit 112 corresponds to one or more circuits for managing a data path between first die 114 and second die 116. In some examples, processor 110 can read data from memory 120 which can be transmitted to first die 114 and/or second die 116 for processing. In other examples, data can be transferred between first die 114 and second die 116 (e.g., for further processing) and subsequently stored in memory 120. Control circuit 112 can facilitate the data transfer between first die 114 and second die 116. For example, control circuit 112 can address issues relating to die crossing for data signals, such as propagating signal between different clock domains, different voltage domains, process skew differences, etc. In some examples, a clock domain can generally refer to clock signal characteristics (e.g., frequency, delay, etc.) for a given die such that different dies having different clock domains can require synchronization. In some examples, a voltage domain can generally refer to signal voltage characteristics (e.g., operating voltage rails, waveforms, etc.) such that different dies having different voltage domains can require level shifting of signals. In some examples, process skew difference can generally refer to differences in physical and/or operating characteristics (e.g., differences in electrical properties, defects, etc., that can affect signal propagation and/or other operating parameters), such as due to variations from fabrication. For instance, first die 114, which can correspond to a chip, chiplet, and/or any other active or passive component, and second die 116, which can correspond to a chip, chiplet, and/or any other active or passive component, can be stacked dies (e.g., having one at least partially overlapping the other). Because first die 114 and second die 116 are not coplanar, first die 114 and second die 116 may be fabricated in different batches, resulting in process skew differences therebetween. Accordingly, signals that cross dies (e.g., from first die 114 to second die 116 and/or from second die 116 to first die 114) can require synchronization. As will be described further below, control circuit 112 can include, incorporate, control, and/or otherwise represent one or more circuits for synchronizing die crossings.

Figure 2:
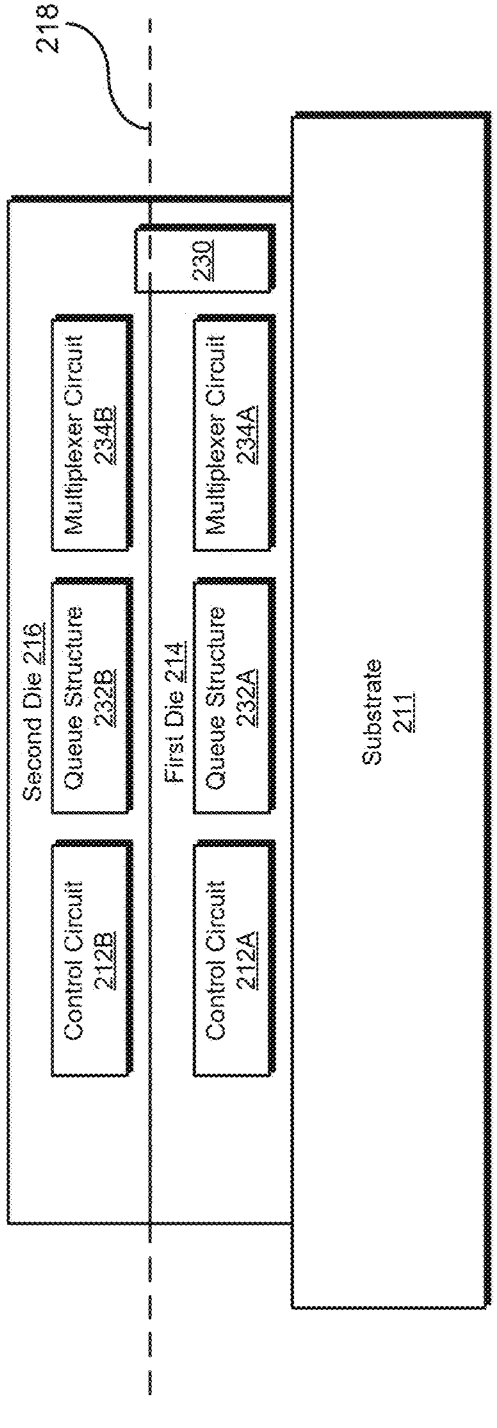
FIG. 2 is a block diagram of an exemplary stacked die architecture.

FIG. 2 illustrates a simplified box diagram of a processor 210 corresponding to processor 110 and/or another integrated circuit (IC) device. FIG. 2 includes a control circuit 212A and a control circuit 212B, each corresponding to iterations of control circuit 112, a first die 214 corresponding to first die 114, a second die 216 corresponding to second die 116, a vertical interconnect 230, and a substrate 211. As illustrated in FIG. 2, second die 216 is stacked over first die 214, which are communicatively coupled by vertical interconnect 230, corresponding to one or more interconnect structures such as a TSV, a BPV, bump, electrode, pad, contact, trace, etc. Moreover, the vertical interconnect structures referenced herein can represent any type of vertical die interconnect structure and a reference to one type can further represent any other type (e.g., a TSV can reference a BPV, etc.) As further illustrated in FIG. 2, vertical interconnect 230 provides a connection across a die boundary 218 that represents different domains (e.g., voltage domains, clock domains, etc.) respectively for first die 214 and second die 216.

FIG. 2 further illustrate example arrangements of a queue structure 232A and a multiplexer circuit 234A with first die 214, and a queue structure 232B and a multiplexer circuit 234B with second die 216. Queue structure 232A and/or queue structure 232B can each correspond to separate and/or combined queue structures for holding data signals (e.g., a payload), such as a first-in-first-out (FIFO) structure, a buffer, etc., and in some examples can correspond to a read buffer, a write buffer, and/or portions thereof. Multiplexer circuit 234A and/or multiplexer circuit 234B can each correspond to separate and/or combined multiplexer (mux) circuits for outputting one input signal selected from many (e.g., two or more) input signals and/or its inverse (e.g., selecting one output signal selected from many output signals) and can further correspond to a hierarchy of multiplexers and/or other controllable logic gate components. In addition, in some implementations multiplexer circuit 234A can selectively couple elements of queue structure 232A (e.g., all elements of queue structure 232A) to a vertical interconnect (e.g., vertical interconnect 230) and multiplexer circuit 234B can selectively couple elements of queue structure 232B (e.g., all elements of queue structure 232B) to a vertical interconnect (e.g., vertical interconnect 230). Further, in some examples, control circuit 212A and/or control circuit 212B can include a delay circuit coupled to vertical interconnect 230 such that vertical interconnect 230 can incorporate a programmable delay.

Sending signals across die boundary 218 can require additional considerations, such as accounting for differences in clock domains, voltage domains, etc., such that signals from first die 214 can be converted for second die 216. However, in some implementations, such conversion can create delays or otherwise complicate sending data signals that are synchronized to cycles of first die 214. A queue structure such as queue structure 232A (and/or queue structure 232B) allows first die 214 to hold data signals for asynchronously sending to second die 216. For example, second die 216 can read from queue structure 232A (and/or queue structure 232B) based on cycles of second die 216. Synchronizing the reading and writing of queue structure 232A (and/or queue structure 232B) can require additional timing and voltage considerations, as will be described further below.

As will also be described further below, in some implementations, the components illustrated in FIG. 2 can be optional, such as one or more of control circuit 212A, control circuit 212B, queue structure 232A, queue structure 232B, multiplexer circuit 234A, multiplexer circuit 234B, such that first die 214 and/or second die 216 may include one or more or fewer iterations of such components. Moreover, although not illustrated in FIG. 2, in some implementations first die 214 and/or second die 216 can include one or more level shifter circuits.

Figure 3:
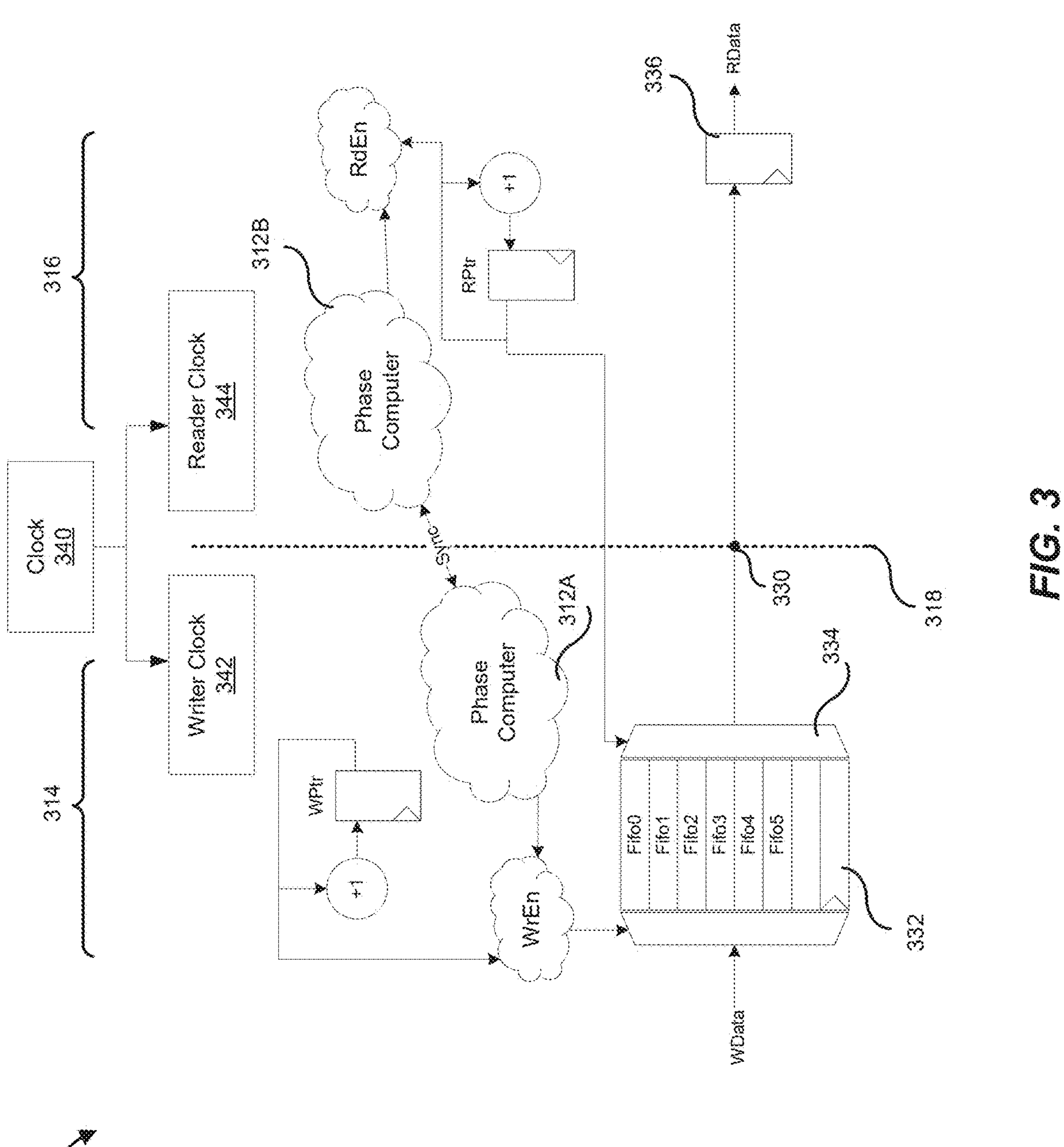
FIG. 3 is a block diagram of an exemplary gearbox architecture.

FIG. 3 illustrates a layout of a system 300 corresponding to processor 210 and/or an IC device. FIG. 3 illustrates a first die 314 (corresponding to first die 214), a second die 316 (corresponding to second die 216), and a clock 340. Clock 340 can correspond to a clock circuit, such as a reference clock circuit for providing a reference clock signal and can be implemented on any die.

First die 314, which in some examples corresponds to a writer or data producer, includes a writer clock 342, a phase computer 312A (corresponding to control circuit 212A), a queue structure 332 (corresponding to queue structure 232A and/or queue structure 232B), and at least portions of a multiplexer circuit 334 (corresponding to multiplexer circuit 234A and/or multiplexer circuit 234B) for sending signals across a die boundary 318 (corresponding to die boundary 218). Second die 316, which in some examples can correspond to a reader or data consumer, includes a reader clock 344, a phase computer 312B (corresponding to control circuit 212B), and a data element 336. Writer clock 342 and reader clock 344 can each correspond to a local clock circuit (e.g., a phase-locked loop (PLL)) for generating a die-local clock signal based on the reference clock signal from clock 340. Data element 336 corresponds to a data storage element (e.g., a latch circuit, flip-flop, etc.) for holding a data signal received from queue structure 332. In addition, a signal path to data element 336 can include a vertical interconnect 330 (corresponding to vertical interconnect 230) across die boundary 318.

FIG. 3 illustrates a simplified gearbox example in which each dies uses a local phase computer (e.g., phase computer 312A and phase computer 312B) for synchronizing across die boundary 318. As illustrated in FIG. 3, phase computer 312A can exchange synchronization information with phase computer 312B such that each phase computer can control which elements of queue structure to be written to and/or read from, for a given time/cycle on each respective die. For example, phase computer 312A can control which element of queue structure 332 to write new data value (e.g., based on a timing control signal from phase computer 312A and a write pointer signal for iterating through index values). Phase computer 312B can incorporate an appropriate delay (e.g., one or more cycles) for selecting which element to read from, which can further incorporate a read pointer signal mirroring the write pointer. Multiplexer circuit 334 can, based on the control signal from phase computer 312B, output the appropriate data value from the appropriate element to data element 336. Although FIG. 3 illustrates an example, in other examples, other configurations can be used, such as multiplexer circuit 334 being implemented in either or both dies. Further, although not illustrated in FIG. 3, level shifter circuits can be used across die boundary 318 (e.g., level shifting signals sent across die boundary 318 as needed for the receiving die).

Figure 4:
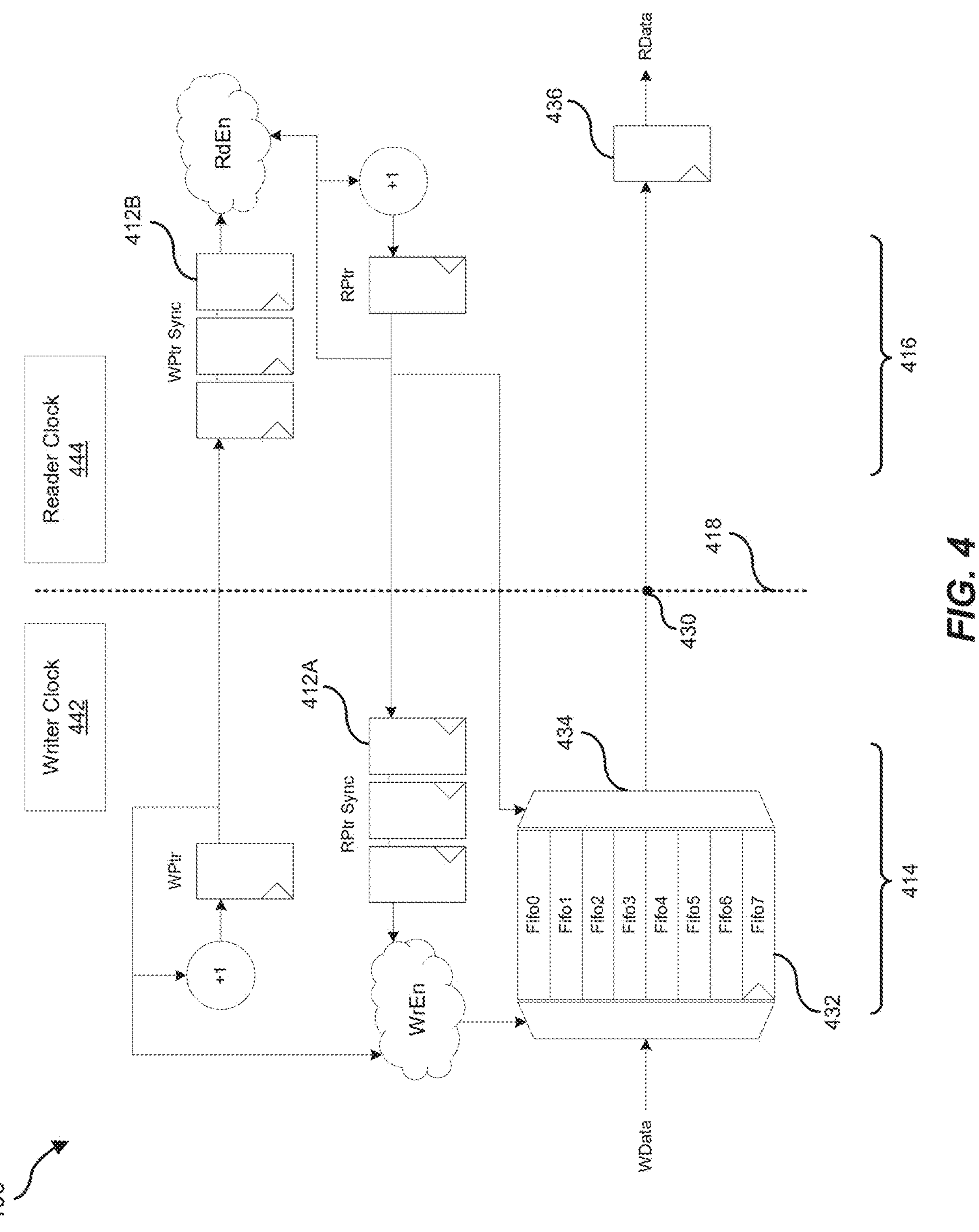
FIG. 4 is a block diagram of an exemplary asynchronous architecture.

FIG. 4 illustrates a layout of a system 400 corresponding to processor 210 and/or an IC device. FIG. 4 illustrates a first die 414 (corresponding to first die 214), and a second die 416 (corresponding to second die 216).

First die 414, which in some examples corresponds to a writer or data producer, includes a write clock 442 (corresponding to writer clock 342), a delay circuit 412A (corresponding to control circuit 212A), a queue structure 432 (corresponding to queue structure 232A and/or queue structure 232B), and at least portions of a multiplexer circuit 434 (corresponding to multiplexer circuit 234A and/or multiplexer circuit 234B) for sending signals across a die boundary 418 (corresponding to die boundary 218). Second die 416, which in some examples can correspond to a reader or data consumer, includes a reader clock 444 (corresponding to reader clock 344), a delay circuit 412B (corresponding to control circuit 212B), and a data element 436 (corresponding to data element 336). In addition, a signal path to data element 436 can include a vertical interconnect 430 (corresponding to vertical interconnect 230) across die boundary 418.

FIG. 4 illustrates a simplified asynchronous example in which each dies uses a local delay circuit (e.g., delay circuit 412A and delay circuit 412B) for synchronizing across die boundary 418. As illustrated in FIG. 4, delay circuit 412A can be configured with an appropriate delay (e.g., an appropriate number of latch circuits corresponding to cycles of delay) and delay circuit 412B can also be configured with an appropriate delay such that each delay circuit can control which elements of queue structure to be written to and/or read from, for a given time/cycle on each respective die. For example, delay circuit 412A can control which element of queue structure 432 to write new data value (e.g., based on a write pointer signal for iterating through index values, and synchronizing with a delayed read pointer signal). Similarly, delay circuit 412B can incorporate an appropriate delay (e.g., one or more cycles) for selecting which element to read from, which can further incorporate a delayed write pointer. Multiplexer circuit 434 can, based on the control signal from delay circuit 412B, output the appropriate data value from the appropriate element to data element 436. Although FIG. 4 illustrates an example, in other examples, other configurations can be used, such as multiplexer circuit 434 being implemented in either or both dies. Further, although not illustrated in FIG. 4, level shifter circuits can be used across die boundary 418 (e.g., level shifting signals sent across die boundary 418 as needed for the receiving die).

Figure 5:
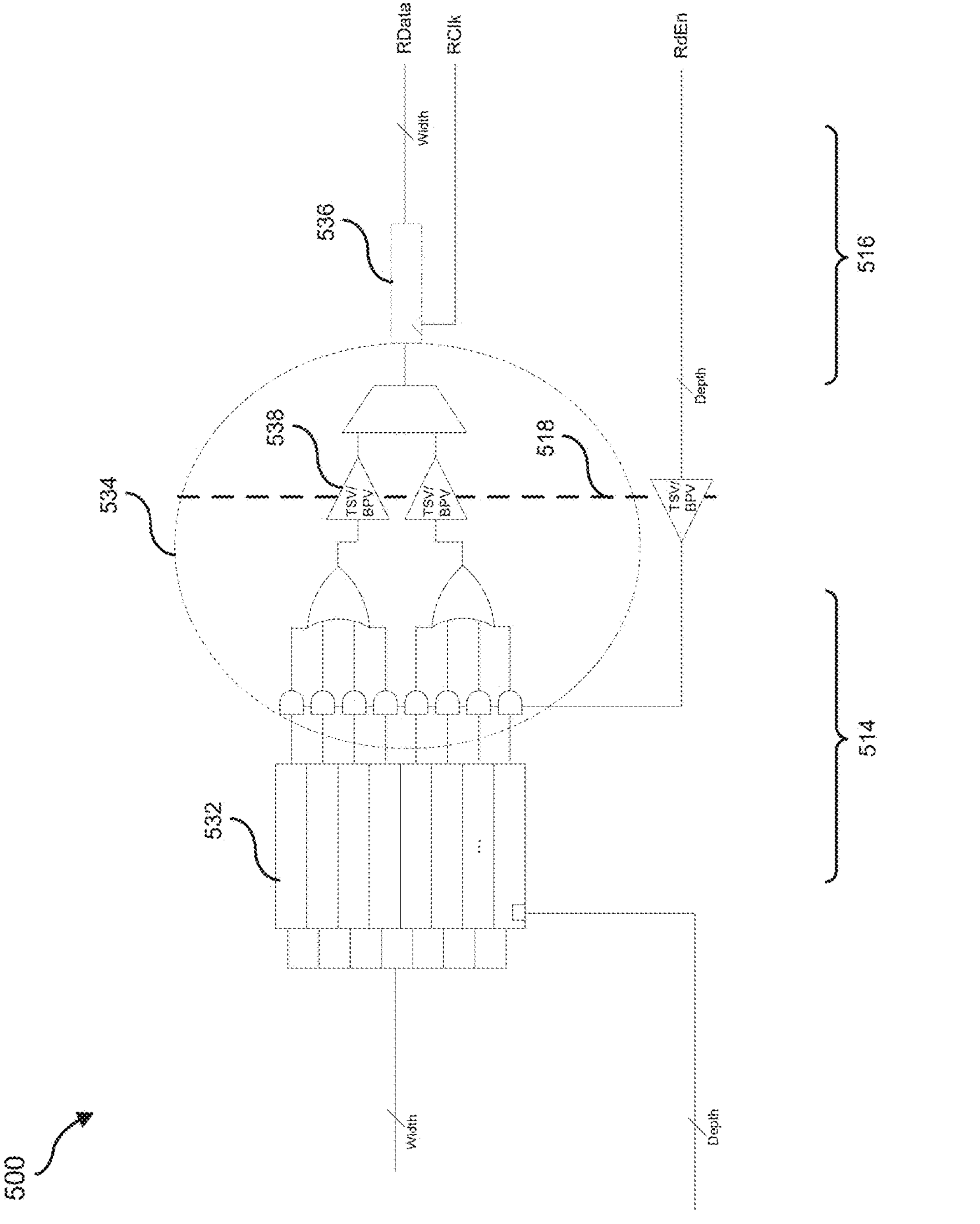
FIG. 5 is a diagram of an exemplary architecture having a multiplexer structure.
Figure 6:
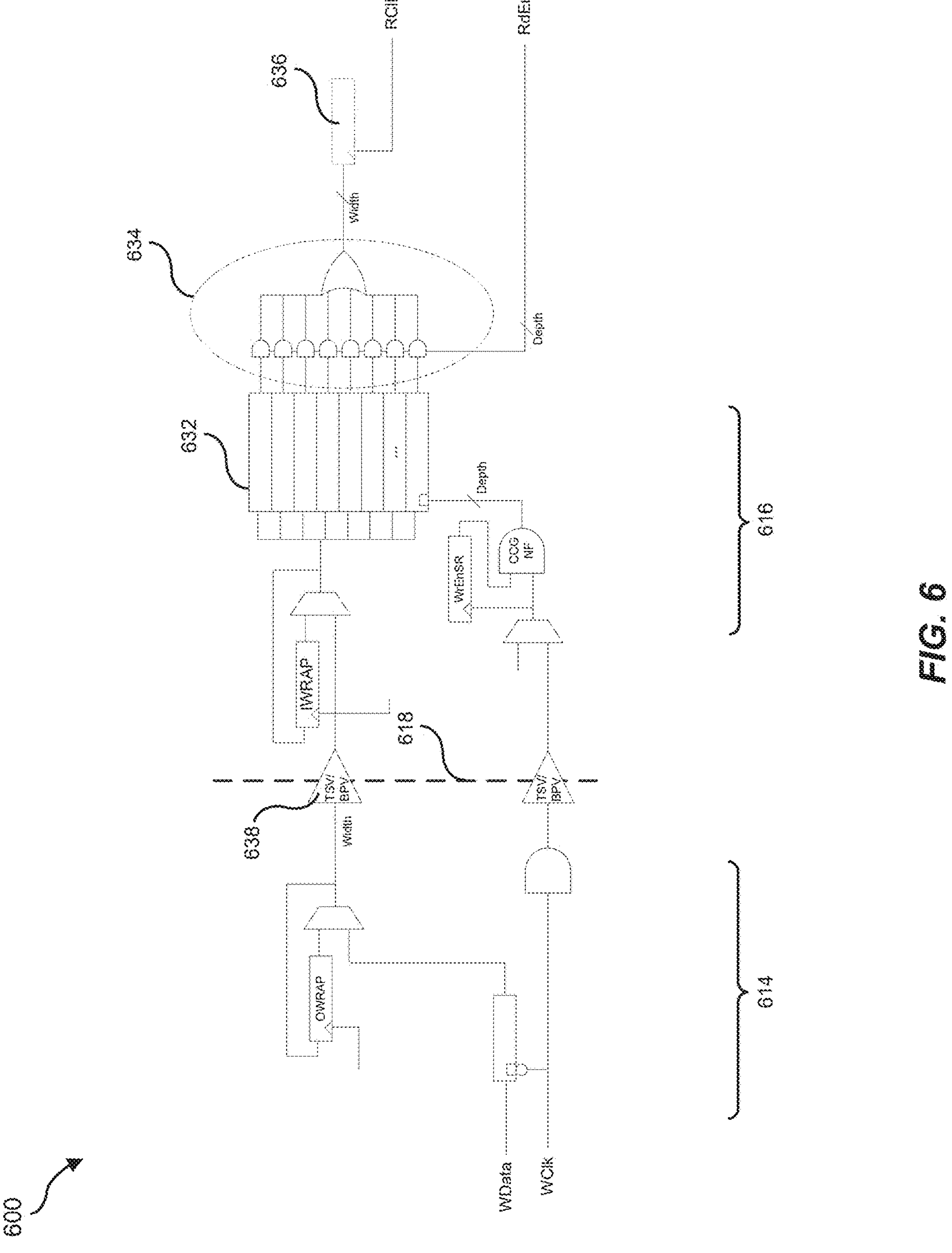
FIG. 6 is a diagram of yet another exemplary architecture having a multiplexer structure.

FIGS. 3 and 4 illustrate examples of how die boundaries correspond to different clock domains and illustrate examples of how queue structures and/or multiplexer circuits can be incorporated in at least one of the dies. FIGS. 5 and 6 further illustrate how die boundaries correspond to different voltage domains and further illustrate additional examples of how queue structures and/or multiplexer circuits can be incorporated in at least one of the dies. Moreover, FIGS. 3 and 4 illustrate simplified examples of the signal paths across die boundaries. As the queue structures described herein include multiple elements, an output path from each element allows the reader to read a desired value. However, multiple signal paths (e.g., vertical interconnects) across die boundaries can be undesirable, for example due to area/layout requirements, signal degradation, power and/or heat, manufacturing complexities, etc. As will be described further below, the systems and methods provided herein can reduce a number of vertical interconnects.

Turning now to FIG. 5, FIG. 5 illustrates a partial layout of a system 500 corresponding to processor 210 and/or an IC device. FIG. 5 illustrates a first die 514 (corresponding to first die 214), and a second die 516 (corresponding to second die 216). First die 514, which in some examples corresponds to a writer or data producer, includes a queue structure 532 (corresponding to queue structure 232A and/or queue structure 232B), and at least portions of a multiplexer circuit 534 (corresponding to multiplexer circuit 234A and/or multiplexer circuit 234B) for sending signals across a die boundary 518 (corresponding to die boundary 218). Second die 516, which in some examples can correspond to a reader or data consumer, includes a data element 536 (corresponding to data element 336).

First die 514 can incorporate queue structure 532 and a significant portion of multiplexer circuit 534 (e.g., more signal paths and/or components of multiplexer circuit 534 is incorporated in first die 514 than second die 516). As illustrated in FIG. 5, in some implementations multiplexer circuit 534 can include a hierarchy of multiplexers, such as a first tier of multiplexers connected to individual elements of queue structure 532 (which in FIG. 5 can be connected through controllable gates), and further connected to a second tier of multiplexers. More specifically, in the example illustrated in FIG. 5, the second tier of multiplexers (e.g., a single multiplexer) can be incorporated across the die boundary. In FIG. 5, vertical interconnects (e.g., TSVs, BPVs, etc.) across die boundary 518 can correspond to or otherwise be connected to (e.g., on either side of die boundary 518) level shifter circuits. For example, a vertical interconnect 538 (e.g., corresponding to vertical interconnect 230) can represent, be coupled to, and/or otherwise be integrated with a level shifter.

As illustrated in FIG. 5, multiplexer circuit 534 advantageously allows a reduced number of vertical interconnects (and/or level shifters) across die boundary 518 from a number of elements in queue structure 532. FIG. 5 illustrates two signal paths (and accordingly, two level shifters and two vertical interconnects) across die boundary 518, although in other examples, fewer or greater number of signal paths can be used.

Turning to FIG. 6, FIG. 6 illustrates another partial layout of a system 600 corresponding to processor 210 and/or an IC device. FIG. 6 illustrates a first die 614 (corresponding to first die 214), and a second die 616 (corresponding to second die 216). In some examples, first die 614 corresponds to a writer or data producer. Second die 616, which in some examples can correspond to a reader or data consumer, includes a queue structure 632 (corresponding to queue structure 232A and/or queue structure 232B), a multiplexer circuit 634 (corresponding to multiplexer circuit 234A and/or multiplexer circuit 234B) for holding signals sent across a die boundary 618 (corresponding to die boundary 218), and a data element 636 (corresponding to data element 336).

Second die 616 can incorporate queue structure 632 and multiplexer circuit 634. As illustrated in FIG. 6, in some implementations first die 614 can write to queue structure 632 across die boundary 618, such as through a single signal path including a vertical interconnect 638 (e.g., corresponding to vertical interconnect 230, and further corresponding to and/or connected to a level shifter). As illustrated in FIG. 6, having queue structure 632 and multiplexer circuit 634 incorporated onto second die 616 advantageously allows a reduced number of vertical interconnects (and/or level shifters) across die boundary 618 from a number of elements in queue structure 632. FIG. 6 illustrates one signal path (and accordingly, vertical interconnect 638 and one level shifter) across die boundary 618, although in other examples, greater number of signal paths can be used.

FIGS. 5 and 6 illustrate example configurations, although in other implementations, other configurations can be used, which can also be integrated in other types of IC devices. For example, in some implementations, both dies can include at least portions of queue structures and/or multiplexer structures (e.g., first die 514 coupled to second die 616). FIGS. 5 and 6 further illustrate examples of control signals (e.g., clock signals and/or pointer signals) sent across the respective die boundaries, although in other examples, fewer or greater control signals can be used.

Moreover, FIGS. 3-6 illustrate a reader/writer pair. In some implementations, each die can incorporate structures associated with reading and further incorporate structures associated with writing, which in some examples can also be at least integrated. For example, referring to FIG. 2, first die 214 can hold data in queue structure 232A to be read by second die 216 through multiplexer circuit 234A, and second die 216 can hold data in queue structure 232B to be read by first die 214 through multiplexer circuit 234B. Any combination of queue structures, multiplexer circuits, level shifters, vertical interconnects, and control circuits described herein can be used for either die. In yet further examples, additional dies can be included, such as a third die stacked on top of second die 216 and having appropriate queue structures, multiplexer circuits, level shifters, vertical interconnects, and control circuits for communicating with first die 214 and/or second die 216.

Figure 7:
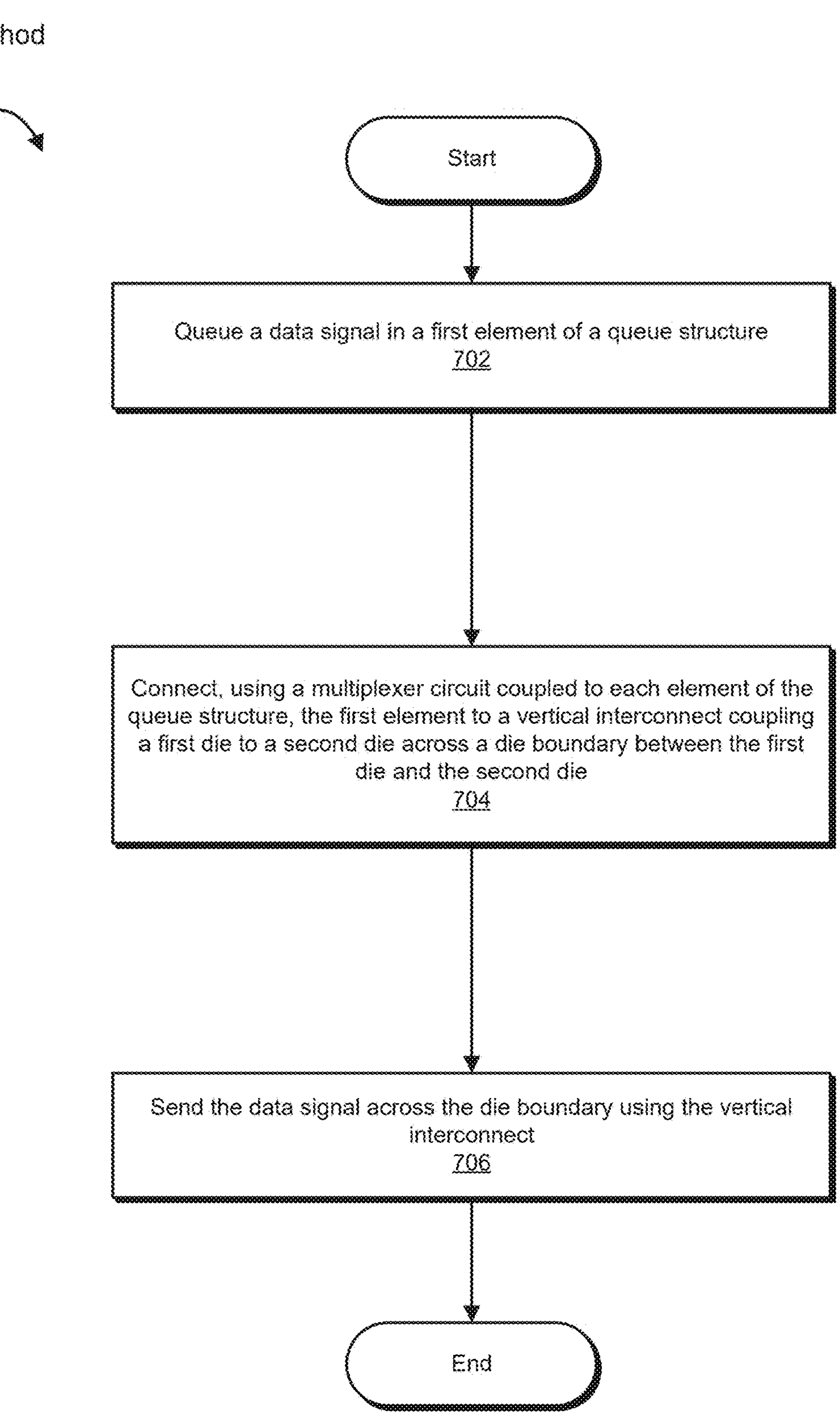
FIG. 7 is a flow diagram of an exemplary method for stacked die crossing of signals.

FIG. 7 is a flow diagram of an exemplary method 700 for stacked die crossing of signals. The steps shown in FIG. 7 can be performed by any suitable circuit, device, and/or computing system, including the system(s) illustrated in FIGS. 1, 2, 3, 4, 5 and/or 6. In one example, each of the steps shown in FIG. 7 represent an algorithm whose structure includes and/or is represented by multiple sub-steps, examples of which will be provided in greater detail below.

As illustrated in FIG. 7, at step 702 one or more of the systems described herein queue a data signal in a first element of a queue structure. For example, first die 214 can queue a data signal in queue structure 232A.

The systems described herein can perform step 702 in a variety of ways. In one example, queueing the data signal can be based on a difference between a first clock domain of first die 214 and a second clock domain of second die 216. In some implementations, control circuit 212A and/or control circuit 212B can be configured to account for the differences in clock domains when queueing the data signal in queue structure 232A. For instance, control circuit 212A can delay writing and/or reading by two cycles (e.g., corresponding to a round trip for a control signal to propagate from first die 214 to second die 216 and back) or another other appropriate number of cycles.

At step 704 one or more of the systems described herein connect, using a multiplexer circuit coupled to each element of the queue structure, the first element to a vertical interconnect coupling a first die to a second die across a die boundary between the first die and the second die. For example, multiplexer circuit 234A can connect queue structure 232A to at least vertical interconnect 230.

At step 706 one or more of the systems described herein send the data signal across the die boundary using the vertical interconnect. For example, the data signal in queue structure 232A can be sent across die boundary 218 using vertical interconnect 230.

In one implementation, a device for stacked die crossing includes a first die, a second die stacked over the first die, and a vertical interconnect coupling the first die to the second die across a die boundary between the first die and the second die. The device further includes a control circuit corresponding to a data path between the first die and the second die, a queue structure for queuing data signals of the data path, and a multiplexer circuit coupled to each element of the queue structure and coupled to the vertical interconnect.

In some examples, the queue structure corresponds to a first-in-first-out (FIFO) structure in the first die. In some examples, the queue structure corresponds to a first-in-first-out (FIFO) structure in the second die. In some examples, the queue structure corresponds to a first first-in-first-out (FIFO) structure in the first die and a second FIFO structure in the second die.

In some examples, the multiplexer circuit corresponds to a tiered multiplexer circuit comprising a first multiplexer coupled to a second multiplexer. In some examples, the first multiplexer is coupled to the second multiplexer across the die boundary via the vertical interconnect. In some examples, the control circuit further comprises a delay circuit coupled to the vertical interconnect.

In some examples, the first die and the second die share a reference clock signal. In some examples, the first die comprises a first phase computer for synchronizing with the reference clock signal. In some examples, the second die comprises a second phase computer for synchronizing with the reference clock signal.

In some examples, the first die uses a first reference clock signal, and the second die uses a second reference clock signal. In some examples, the control circuit further comprises a level shifter coupled to the multiplexer circuit and the vertical interconnect.

In one implementation, a system for stacked die crossing includes a memory and a processor comprising a first die, a second die stacked over the first die, and a vertical interconnect coupling the first die to the second die across a die boundary between the first die and the second die. The processor also includes a control circuit corresponding to a data path between the first die and the second die, a queue structure for queuing data signals of the data path, a multiplexer circuit coupled to each element of the queue structure and coupled to the vertical interconnect, and a level shifter coupled to multiplexer circuit and the vertical interconnect and configured for sending data signals across the die boundary.

In some examples, the queue structure corresponds to a first-in-first-out (FIFO) structure in the first die or the second die. In some examples, the queue structure corresponds to a first first-in-first-out (FIFO) structure in the first die and a second FIFO structure in the second die.

In some examples, the multiplexer circuit corresponds to a tiered multiplexer circuit comprising a first multiplexer coupled to a second multiplexer. In some examples, the first multiplexer is coupled to the second multiplexer across the die boundary via the vertical interconnect. In some examples, the control circuit further comprises a delay circuit coupled to the vertical interconnect.

In some examples, the first die and the second die share a reference clock signal. In some examples, the first die comprises a first phase computer for synchronizing with the reference clock signal. In some examples, the second die comprises a second phase computer for synchronizing with the reference clock signal. In some examples, the first die uses a first reference clock signal, and the second die uses a second reference clock signal.

In one implementation, a method for stacked die crossing includes (i) queueing a data signal in a first element of a queue structure, (ii) connecting, using a multiplexer circuit coupled to each element of the queue structure, the first element to a vertical interconnect coupling a first die to a second die across a die boundary between the first die and the second die, and (iii) sending the data signal across the die boundary using the vertical interconnect.

In some examples, queueing the data signal is based on a difference between a first clock domain of the first die and a second clock domain of the second die.

As detailed above, communicating across vertical interconnects (e.g., TSVs, BPVs, etc.) can present various timing challenges because the two dies can have large process skew differences or be implemented in different process technologies. Synchronous communication can be desirable for low latency communication but often requires tight timing and skew requirements on both the clock and the data. Using gearbox FIFOs can, in some examples, allow for greater skew differences between the die making the timing easier to close. Full async FIFOs can, in some examples, allow for the stacked die to be clocked at a different frequency which allows the die to run at different frequencies that correspond with their different potentially different technologies.

Efficient, low-latency communication between die is desirable and can allow separating logic functions efficiently between the stacked dies. These interface signals can be individual control bits or extremely large with 100s-1000s of signals contributing to a single piece of data. Implementing these interfaces efficiently across multiple dies can be challenging and can conventionally consume a large number of vertical interconnects. As described herein, utilizing source-synchronous clocking into on-die data FIFOs can reduce the number of vertical interconnects consumed by these async crossings.

Accordingly, the systems and methods described herein can advantageously address the die crossing problem of synchronization between stacked dies, while meeting the bandwidth requirement between dies (as FIFO queue size is less restricted). The systems and methods provided herein further address the issues with needing too many vertical interconnects between the dies, by providing a reduction of vertical interconnects for a given FIFO queue size.

As detailed above, the computing devices and systems described and/or illustrated herein broadly represent any type or form of computing device or system capable of executing computer-readable instructions, such as those contained within the modules described herein. In their most basic configuration, these computing device(s) each include at least one memory device and at least one physical processor.

In some examples, the term "memory device" generally refers to any type or form of volatile or non-volatile storage device or medium capable of storing data and/or computer-readable instructions. In one example, a memory device stores, loads, and/or maintains one or more of the modules and/or circuits described herein. Examples of memory devices include, without limitation, Random Access Memory (RAM), Read Only Memory (ROM), flash memory, Hard Disk Drives (HDDs), Solid-State Drives (SSDs), optical disk drives, caches, variations, or combinations of one or more of the same, or any other suitable storage memory.

In some examples, the term "physical processor" generally refers to any type or form of hardware-implemented processing unit capable of interpreting and/or executing computer-readable instructions. In one example, a physical processor accesses and/or modifies one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SoCs), digital signal processors (DSPs), Neural Network Engines (NNEs), accelerators, graphics processing units (GPUs), portions of one or more of the same, variations or combinations of one or more of the same, or any other suitable physical processor.

Although illustrated as separate elements, the modules described and/or illustrated herein can represent portions of a single module or application. In addition, in certain implementations one or more of these modules can represent one or more software applications or programs that, when executed by a computing device, cause the computing device to perform one or more tasks. For example, one or more of the modules described and/or illustrated herein represent modules stored and configured to run on one or more of the computing devices or systems described and/or illustrated herein. In some implementations, a module can be implemented as a circuit or circuitry. One or more of these modules can also represent all or portions of one or more special-purpose computers configured to perform one or more tasks.

In some implementations, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:

a first die corresponding to a first voltage domain;

a second die stacked over the first die and corresponding to a second voltage domain;

a vertical interconnect coupling the first die to the second die across a die boundary between the first die and the second die;

a control circuit corresponding to a data path between the first die and the second die;

a queue structure for queuing data signals of the data path;

a multiplexer circuit coupled to each element of the queue structure and coupled to the vertical interconnect; and a level shifter coupled to the multiplexer circuit and the vertical interconnect and configured for sending data signals across the die boundary by level shifting the data signals between the first voltage domain and the second voltage domain.

2. The device of claim 1, wherein the queue structure corresponds to a first-in-first-out (FIFO) structure in the first die.

3. The device of claim 1, wherein the queue structure corresponds to a first-in-first-out (FIFO) structure in the second die.

4. The device of claim 1, wherein the queue structure corresponds to a first first-in-first-out (FIFO) structure in the first die and a second FIFO structure in the second die.

5. The device of claim 1, wherein the multiplexer circuit corresponds to a tiered multiplexer circuit comprising a first multiplexer coupled to a second multiplexer.

6. The device of claim 5, wherein the first multiplexer is coupled to the second multiplexer across the die boundary via the vertical interconnect.

7. The device of claim 1, wherein the control circuit further comprises a delay circuit coupled to the vertical interconnect.

8. The device of claim 1, wherein:

the first die and the second die share a reference clock signal;

the first die comprises a first phase computer for synchronizing with the reference clock signal; and the second die comprises a second phase computer for synchronizing with the reference clock signal.

9. The device of claim 1, wherein the first die uses a first reference clock signal and the second die uses a second reference clock signal.

10. A system comprising:

a memory configured to store data; and an integrated circuit device coupled to the memory and comprising:

a first die corresponding to a first voltage domain;

a second die stacked over the first die and corresponding to a second voltage domain;

a vertical interconnect coupling the first die to the second die across a die boundary between the first die and the second die;

a control circuit corresponding to a data path between the first die and the second die for transmitting the data read from the memory;

a queue structure for queuing data signals of the data path;

a multiplexer circuit coupled to each element of the queue structure and coupled to the vertical interconnect; and a level shifter coupled to the multiplexer circuit and the vertical interconnect and configured for sending data signals across the die boundary by level shifting the data signals between the first voltage domain and the second voltage domain.

11. The system of claim 10, wherein the queue structure corresponds to a first-in-first-out (FIFO) structure in the first die or the second die.

12. The system of claim 10, wherein the queue structure corresponds to a first first-in-first-out (FIFO) structure in the first die and a second FIFO structure in the second die.

13. The system of claim 10, wherein the multiplexer circuit corresponds to a tiered multiplexer circuit comprising a first multiplexer coupled to a second multiplexer.

14. The system of claim 13, wherein the first multiplexer is coupled to the second multiplexer across the die boundary via the vertical interconnect.

15. The system of claim 10, wherein the control circuit further comprises a delay circuit coupled to the vertical interconnect.

16. The system of claim 10, wherein:

the first die and the second die share a reference clock signal;

the first die comprises a first phase computer for synchronizing with the reference clock signal; and the second die comprises a second phase computer for synchronizing with the reference clock signal.

17. The system of claim 10, wherein the first die uses a first reference clock signal and the second die uses a second reference clock signal.

18. A method comprising:

queueing a data signal in a first element of a queue structure;

connecting, using a multiplexer circuit coupled to each element of the queue structure, the first element to a vertical interconnect coupling a first die to a second die across a die boundary between the first die and the second die, wherein the first die corresponds to a first voltage domain and the second die corresponds to a second voltage domain; and sending the data signal across the die boundary by using the vertical interconnect and by level shifting the data signals between the first voltage domain and the second voltage domain.

19. The method of claim 18, wherein queueing the data signal is based on a difference between a first clock domain of the first die and a second clock domain of the second die.

20. The device of claim 1, wherein the first die corresponds to a first clock domain and the second die corresponds to a second clock domain.

* * * * *